(12) United States Patent
Bayerer et al.

(10) Patent No.: US 10,879,148 B2
(45) Date of Patent: Dec. 29, 2020

(54) POWER SEMICONDUCTOR MODULE ARRANGEMENT

(71) Applicant: Infineon Technologies AG, Neubiberg (DE)

(72) Inventors: Reinhold Bayerer, Reichelsheim (DE); Frank Sauerland, Werne (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/579,099

(22) Filed: Sep. 23, 2019

(65) Prior Publication Data

US 2020/0098662 A1    Mar. 26, 2020

(30) Foreign Application Priority Data

Sep. 24, 2018 (EP) .................... 18196185

(51) Int. Cl.

| H01L 23/15 | (2006.01) |
|---|---|
| H01L 23/373 | (2006.01) |
| H01L 23/498 | (2006.01) |
| H01L 23/538 | (2006.01) |
| H01L 25/07 | (2006.01) |
| H01L 25/18 | (2006.01) |
| H05K 7/20 | (2006.01) |

(52) U.S. Cl.
CPC .......... *H01L 23/3736* (2013.01); *H01L 23/15* (2013.01); *H01L 23/49866* (2013.01); *H01L 23/5383* (2013.01); *H01L 25/072* (2013.01); *H01L 25/18* (2013.01); *H05K 7/209* (2013.01)

(58) Field of Classification Search
CPC . H01L 23/15; H01L 23/3735; H01L 23/3736; H01L 23/42; H01L 23/49866; H01L 23/5383; H01L 25/072; H01L 25/18; H05K 7/209; B32B 7/02
See application file for complete search history.

(56) References Cited

U.S. PATENT DOCUMENTS

2016/0284664 A1    9/2016  Hohlfeld

FOREIGN PATENT DOCUMENTS

| DE | 19647590 A1 | 5/1998 |
|---|---|---|
| DE | 102009028360 B3 | 12/2010 |
| DE | 102011079708 A1 | 1/2013 |
| DE | 102013113232 A1 | 6/2014 |

(Continued)

*Primary Examiner* — Lawrence D Ferguson
(74) *Attorney, Agent, or Firm* — Murphy, Bilak & Homilier, PLLC

(57) ABSTRACT

A power semiconductor module arrangement includes a semiconductor substrate having first and second metallization layers attached to a dielectric insulation layer, the dielectric insulation layer being disposed between the metallization layers. A layer of heat-conducting material is arranged between the semiconductor substrate and a base plate in a vertical direction of the power semiconductor module arrangement. The layer of heat-conducting material is arranged adjacent to a plane surface of the semiconductor substrate and adjacent to a plane surface of the base plate. The semiconductor substrate has a first thermal expansion coefficient of 8 ppm/K or lower, the base plate has a second thermal expansion coefficient of 9 ppm/K or lower, and the layer of heat-conducting material has a third thermal expansion coefficient of 18 ppm/K or higher. The layer of heat-conducting material has a thickness in the vertical direction of between 40 μm and 150 μm.

20 Claims, 2 Drawing Sheets

(56) References Cited

FOREIGN PATENT DOCUMENTS

| | | |
|---|---|---|
| DE | 202015006897 U1 | 12/2015 |
| DE | 112014004770 T5 | 6/2016 |
| DE | 102009045063 C5 | 6/2017 |
| DE | 102016125348 A1 | 6/2018 |
| EP | 2012354 B1 | 4/2016 |
| JP | 2009070863 A | 4/2009 |

POWER SEMICONDUCTOR MODULE ARRANGEMENT

TECHNICAL FIELD

The instant disclosure relates to a power semiconductor module arrangement, in particular to a power semiconductor module arrangement comprising a semiconductor substrate.

BACKGROUND

Power semiconductor module arrangements usually include at least one substrate. The substrate may be arranged on a base plate. A semiconductor arrangement including a plurality of semiconductor components (e.g., two diodes, MOSFETs, JFETs, HEMTs, IGBTs, or any other suitable controllable semiconductor elements in a parallel, half-bridge, or any other configuration) is usually arranged on at least one of the at least one substrates. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. The first metallization layer may he a structured layer while the second metallization layer is usually a continuous layer. The second metallization layer may be attached to a base plate.

Heat that is generated by the controllable semiconductor components is dissipated through the substrate to the base plate. A heat-conducting layer is usually arranged between the substrate and the base plate to effectively conduct the heat away from the substrate. The substrate, the base plate and the heat-conducting layer, however, usually each have a different coefficient of thermal expansion. A mismatch of the thermal expansion coefficients of the different parts, however, may result in a degradation of the heat-conducting layer due to thermal cycling and the different linear expansion of the different parts during the use of the power semiconductor module arrangement. In particular, a shear stress arising in the heat-conducting layer may accelerate the degradation of the heat-conducting layer. The shear stress within t conducting layer may be caused, inter alia, by a different linear expansion of the substrate and the base plate when heated.

There is a need for an improved power semiconductor module arrangement which provides for a good thermal conductivity between the substrate and the base plate and which has an increased lifetime.

SUMMARY

A power semiconductor module arrangement includes a semiconductor substrate including a dielectric insulation layer, a first metallization layer attached to the dielectric insulation layer, and a second metallization layer attached to the dielectric insulation layer, wherein the dielectric insulation layer is disposed between the first and second metallization layers. The power semiconductor module arrangement further includes a base plate, and a layer of heat-conducting material arranged between the semiconductor substrate and the base plate in a vertical direction of the power semiconductor module arrangement. The layer of heat-conducting material is arranged adjacent to a surface of the semiconductor substrate and adjacent to a surface of the base plate, wherein the surface of the semiconductor substrate and the surface of the base plate are plane surfaces. The semiconductor substrate has a first thermal expansion coefficient of 8 ppm/K or lower, the base plate has a second thermal expansion coefficient of 9 ppm/K. or lower, and the layer of heat-conducting material has a third thermal expansion coefficient that is 18 ppm/K or higher. The layer of heat-conducting material has a thickness in the vertical direction, wherein the thickness is between 40 µm and 150 µm.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. in the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
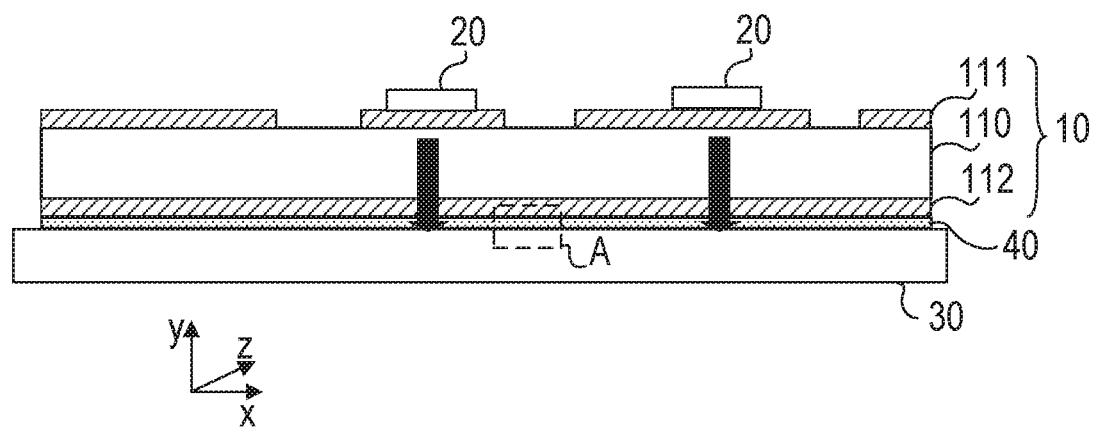
FIG. 1 schematically illustrates a cross-sectional view of a semiconductor substrate arrangement.

FIG. 1 exemplarily illustrates a semiconductor substrate 10. The semiconductor substrate 10 includes a dielectric insulation layer 110, a (structured) first metallization layer 111 attached to the dielectric insulation layer 110, and a second metallization layer 112 attached to the dielectric insulation layer 110. The dielectric insulation layer 110 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. Optionally, the first and/or second metallization layer 111, 112 may be covered by a thin layer of nickel or silver, for example. Such a layer may be formed using a nickel plating process or a silver plating process, for example. The semiconductor substrate 10 may be a ceramic substrate, that is, a substrate in which the dielectric insulation layer 110 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 110 may consist of or include one of the following materials: $Al_2O_3$, AlN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate.

Usually one or more semiconductor bodies 20 are arranged on a semiconductor substrate 10. Each of the semiconductor bodies :20 arranged on a semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. One or more semiconductor bodies 20 may form a semiconductor arrangement on the semiconductor substrate. In FIG. 1, two semiconductor bodies 20 are exemplarily illustrated. Any other number of semiconductor bodies 20, however, is also possible.

In the example illustrated in FIG. 1, the semiconductor substrate 10 is attached to a base plate 30 with the second metallization layer 112 arranged between the dielectric insulation layer 110 and the base plate 30. A layer 40 of heat-conducting material is arranged between the second metallization layer 112 and the base plate 30 and is configured to form a firm substance-to-substance bond between the semiconductor substrate 10 and the base plate 30. Heat that is generated by the semiconductor bodies 20 may be dissipated through the semiconductor substrate 10 and the layer 40 of heat-conducting material to the base plate 30. This is exemplarily illustrated by the bold arrows in FIG. 1. The second metallization layer 112 of the semiconductor substrate 10 in FIG. 1 is a continuous layer. The first metallization layer 111 is a structured layer in the arrangement illustrated in FIG. 1. "Structured layer" in this context means that the first metallization layer 111 is not a continuous layer, but includes recesses between different sections of the layer. Such recesses are schematically illustrated in FIG. 1. The first metallization layer 111 in this arrangement exemplarily includes four different sections. Different semiconductor bodies 20 may be mounted to the same or to different sections of the first metallization layer 111. Different sections of the first metallization layer 111 may have no electrical connection or may be electrically connected to one or more other sections using electrical connections such as, e.g., bonding wires. Electrical connections may also include connection plates or conductor rails, for example, to name just a few examples. The first metallization layer 111 being a structured layer, however, is only an example. It is also possible that the first metallization layer 111 be a continuous layer. According to another example, the semiconductor substrate 10 may only comprise a dielectric insulation layer 110 and a first metallization layer 111. The second metallization layer 112 may be omitted.

The base plate 30 may comprise a metal. According to one example, the base plate comprises at least one of Al and Cu. According to another example, the base plate 30 may be a metal matrix composite (MMC) base plate comprising an MMC material such as AlSiC. Any other suitable materials are possible. The base plate 30, optionally, may also be covered by a thin layer of nickel or silver, for example. Such a layer may be formed using a nickel plating process or a silver plating process, for example.

The thermal expansion coefficient of semiconductor substrates 10 usually lies in the range of 8 ppm/K or lower. A ceramic material that is used for semiconductor substrates may have a CTE of between 4 ppm/K and 8 ppm/K. However, ceramic materials having a CTE of >8 ppm/K are also known. E.g., zirconium dioxide ceramics usually have a CTE of about 10.5 ppm/K. The thermal expansion coefficient of typical base plates is generally higher than the CTE of typical substrates, and usually lies in the range of about 18 ppm/K. The thermal expansion coefficient of typical heat-conducting pastes usually lies in the range of about 18 ppm/K. or even >20 ppm/K.

The difference between the thermal expansion coefficients CTE of typical substrates and that of base plates is problematic in many cases. The different CTEs may lead to severe damage of the power semiconductor module arrangement, especially within the layer 40 of heat-conducting material that is used to attach the substrate 10 to the base plate 30. This is because the substrate 10 and the base plate 30, when heated, expand to a different degree (linear expansion), resulting in shear forces within the substrate 10 and the base plate 30. This again may result in shear forces within the layer 40 of heat-conducting material. When using an MMC base plate, for example, the thermal expansion coefficient of the base plate 30 may be adjusted to the CTE of typical semiconductor substrates. Considering the vertical gradient in temperature of the arrangement including the substrate 10, the layer 40 and the base plate 30, the CTE of the base plate 30 may be higher to some extent. MMC base plates usually have a CTE of about 9 ppm/K or about 8 ppm/K or lower. Choosing a base plate 30 having a CTE that is essentially equal to the CTE of the substrate 10 may significantly reduce the stress that is induced on the power semiconductor module arrangement because the substrate 10 and the base plate 30 expand to a similar degree, resulting in essentially equal linear expansion. For example, a difference between the CTEs of the semiconductor substrate 10 and the $CTE_{BP}$ of the base plate 30 may be 5 ppm/K or lower ($|CTE_S-CTE_{BP}|<5$ ppm/K), 3 ppm/K or lower ($|CTE_S-CTE_{BP}|<3$ ppm/K), or 2 ppm/K or lower ($|CTE_S-CTE_{BP}|<2$ ppm/K). Preferably, the base plate 30 has a CTE that is higher than the CTE of the substrate 10. The substrate 10 may have a CTE of 4 ppm/K, 6 ppm/K, or 8 ppm/K, for example. Choosing a base plate 30 with a CTE of 8 ppm/K or 9 ppm/K results in a difference of the CTEs between the substrate 10 and the base plate 30 of 5 ppm/K, 4 ppm/K, 3 ppm/K, 2 ppm/K, 1 ppm/K, or 0 ppm/K, respectively. While the CTEs of the substrate 10 and the base plate 30 may be adjusted to each other, the layer 40 of heat-conducting material that is arranged between the substrate 10 and the base plate 30 remains problematic, having a CTE that is significantly higher than both the CTE of the substrate 10 and the CTE of the base plate 30. This results in a three-dimensional deformation of the layer 40 during each thermal cycle. The layer 40 of heat-conducting material may be a solder layer, for example. According to one example, the layer 40 may comprise at least one of Au, SnAu, SnAg, SnCu, SnSb, and an eutectic alloy (e.g., $Sn_{63}Pb_{37}$).

With respect to differences in thermal expansion, one also has to consider the temperature gradient from chip (semiconductor body 20) to heat sink or to ambient. As thermal cycles are caused by power losses within the chip, resulting in the chips having the highest temperature, and temperature decreasing from layer to layer (semiconductor substrate, base plate) downwards towards the heat sink and finally the ambient. Therefore the linear thermal expansion may be similar in base plate and substrate for a CTE of the base plate that is a little higher than the CTE of the substrate. However, the magnitude of vertical gradient in temperature depends on cooling intensity in the application of the modules and differs from case to case. Therefore, adjusting the thermal expansion from baseplate to substrate is the compromise.

Figure 2:
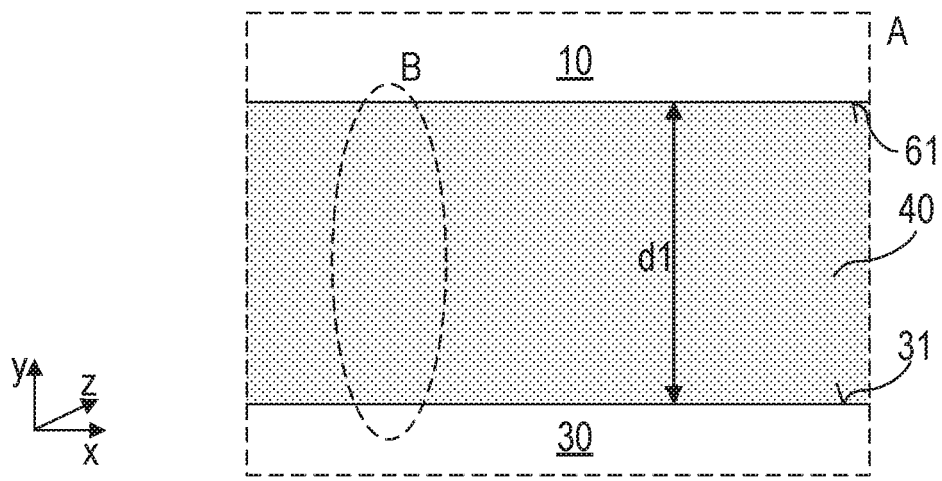
FIG. 2 schematically illustrates a cross-sectional view of a section of the semiconductor substrate arrangement of FIG. 1 according to one example.

In order to reduce the stress on the layer 40 of heat-conducting material, according to one example, the thickness d1 of the layer 40 is kept comparably small. That is, a thickness d1 of the layer 40 between the substrate 10 and the base plate 30 is chosen from between 40 μm and 150 μm. A thickness d1 of less than 150 μm may be chosen in order to reduce the stress that is induced on the layer 40. The layer 40 usually covers a comparably large area of the base plate 30 and the substrate 10. For example, in the horizontal directions x, z, the layer 40 may cover an area of up to 4 cm$^2$ or even up to 10 cm$^2$ and more. When heated, the material of the layer 40 expands significantly. Material that is arranged in a central part of the layer 40 is surrounded by other material horizontally (see section B in FIG. 2). Therefore, this material can only expand in a vertical direction y. The neighboring material prevents the material in this inner section B from expanding in width. This results in a three-dimensional deformation of the layer 40 each time the temperature changes.

A minimum thickness di may be chosen in order to allow at least for a certain difference of expansion between the substrate 10 and the base plate 40.

Figure 3:
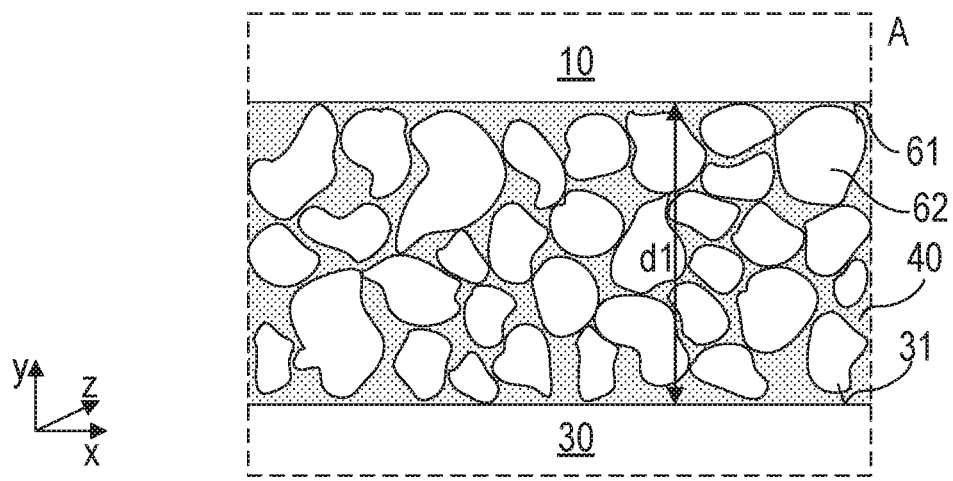
FIG. 3 schematically illustrates a cross-sectional view of the section of the semiconductor substrate arrangement of FIG. 1 according to another example.

Known heat-conducting (solder) layers generally have a thermal conductivity of between 15 and 60 W/mK. This, however, may not be enough for certain applications. Therefore, in order to further increase the thermal conductivity of the layer 40, thermally conductive particles 62 may he added to the heat-conducting layer 40. This is schematically illustrated in FIG. 3, which shows the section A of the power semiconductor module arrangement of FIG. 1.

The thermally conductive particles 62 that may be added to the layer 40 of heat-conducting material may be evenly distributed within the layer 40. The thermal conductivity of the particles 62 is generally greater than the thermal conductivity of the surrounding material of the heat-conducting layer 40. For example, the particles 62 may have a thermal conductivity of more than 60 W/mK. For example, the particles 62 may have a thermal conductivity of between 60 and 400 W/mK. The particles 62 may comprise a ceramic material, glass, or a metal powder, for example. The mixture comprising the material of the heat-conducting layer 40 and the particles 62, however, usually still has a CTE that is significantly higher than the CTEs of the substrate 10 and the base plate 30. A diameter of each of the particles may he equal to or less than the thickness d1 of the layer 40. According to one example, a diameter of at least a part of the particles 62 equals the thickness d1 of the layer 40. In this way, the particles 62 may function as spacers, as will be described in further detail with respect to FIG. 4 below.

In a power semiconductor arrangement comprising a substrate 10 and a base plate 30 which have essentially matching CTEs, and further comprising only a thin layer 40 (e.g., with a thickness d1 of between 40 μm and 150 μm) of heat-conducting material between the substrate 10 and the base plate 30, it is generally not necessary to provide an anchoring structure or anything similar. An anchoring structure may comprise indentations/protrusions in the second metallization layer 112 of the substrate 10, for example. Such protrusions reach into the layer 40 and are surrounded by the material of the layer 40. The function of such anchoring structures is to distribute the mechanical stress over the full thickness of the layer 40. For the geometry of the metallization layer 112 in each case (semiconductor assembly, circuit substrate size, shape and material of the baseplate), an anchoring structure may be optimized so that the mechanical stress is correspondingly distributed and reduced.

In the present case, however, the surface 61 of the second metallization layer 112 as well as the surface 31 of the base plate 30 may be plane and not comprise any indentations or protrusions. This is because the mechanical stress is reduced by adapting the CTEs of the substrate 10 and the base plate 30 and by forming only a thin layer 40 of heat-conducting material between the substrate 10 and the base plate. "Plane" in this context also refers to surfaces 31, 61 having a certain surface roughness that results from the manufacturing process of the surface 31, 61. For example, metallization layers 111, 112 of a semiconductor substrate usually have a certain surface roughness. The surfaces having such a common surface roughness, however, are still essentially plane in the sense of the present invention.

In the following, several different examples of possible power semiconductor arrangements are given.

According to a first example, the substrate comprises a CTE of <8 ppm/K. The base plate 30 is an MMC base plate having a CTE of about 8 ppm/K or less. The thickness d1 of the heat-conducting layer 40 is between 40 μm and 150 μm.

According to a second example, the substrate 10 is an AlN substrate. That is, the dielectric insulation layer 110 comprises AlN. The dielectric insulation layer 110 has a thickness of about 1 mm in the vertical direction v. Each of the first and second metallization layers 111, 112 comprises copper (Cu) and has a thickness of about 300 μm in the vertical direction y. Each of the first and second metallization layers 111, 112 may be covered by a thin layer of nickel or silver, as has been described above. The base plate 30 is an MMC base plate having a CTE of about 8 ppm/K or lower. The thickness di of the layer 40 is between 70 μm and 120 μm.

According to a third example, the substrate 10 is a Si$_3$N$_4$ substrate. That is, the dielectric insulation layer 110 comprises Si$_3$N$_4$. The dielectric insulation layer 110 has a thickness of about 1 mm in the vertical direction v. Each of the first and second metallization layers 111, 112 comprises copper and has a thickness of about 300 μm in the vertical direction y. Each of the first and second metallization layers 111, 112 may be covered by a thin layer of nickel or silver, as has been described above. The base plate 30 is an MMC base plate having a CTE of about 8 ppm/K or lower. The thickness d1 of the layer 40 is between 70 μm and 120 μm.

According to a fourth example, the substrate 10 is an AlN substrate. That is, the dielectric insulation layer 110 comprises AlN. The dielectric insulation layer 110 has a thickness of about 1 mm in the vertical direction y. Each of the first and second metallization layers 111, 112 comprises copper and has a thickness of about 300 μm in the vertical direction y. Each of the first and second metallization layers 111, 112 may be covered by a thin layer of nickel or silver, as has been described above. The base plate 30 is an MMC base plate having a CTE of about 5 ppm/K or lower. The thickness dl of the layer 40 is between 40 μm and 70 μm.

According to a fifth example, the substrate 10 is a Si$_3$N$_4$ substrate. That is, the dielectric insulation layer 110 comprises Si$_3$N$_4$. The dielectric insulation layer 110 has a thickness of about 1 mm in the vertical direction y. Each of the first and second metallization layers 111, 112 comprises copper and has a thickness of about 300 μm in the vertical direction y. Each of the first and second metallization layers 111, 112 may be covered by a thin layer of nickel or silver, as has been described above. The base plate 30 is an MMC base plate having a CTE of about 5 ppm/K or lower. The thickness d1 of the layer 40 is between 40 μm and 70 μm.

According to a sixth example, the substrate 10 is an $Al_2O_3$ substrate. That is, the dielectric insulation layer 110 comprises $Al_2O_3$. The dielectric insulation layer 110 has a thickness of about 0.38 mm to 0.63 mm in the vertical direction y. Each of the first and second metallization layers 111, 112 comprises copper and has a thickness of about 300 μm in the vertical direction y. Each of the first and second metallization layers 111, 112 may be covered by a thin layer of nickel or silver, as has been described above. The base plate 30 is an MMC base plate having a CTE of about 8 ppm/K or lower. The thickness d1 of the layer 40 is between 70 μm and 120 μm.

Generally speaking, the thickness of the dielectric insulation layer 110 may be chosen from a range between 0.1 mm to 2.0 mm. The thickness of the first and the second metallization layers 111, 112 may each be chosen from a range between 0.1 mm and 2.0 mm. The first metallization layer 111 may have the same or a different thickness than the second metallization layer 112. A thickness of the base plate 30 in the vertical direction may be chosen from between 3 mm to 10 mm.

Figure 4:
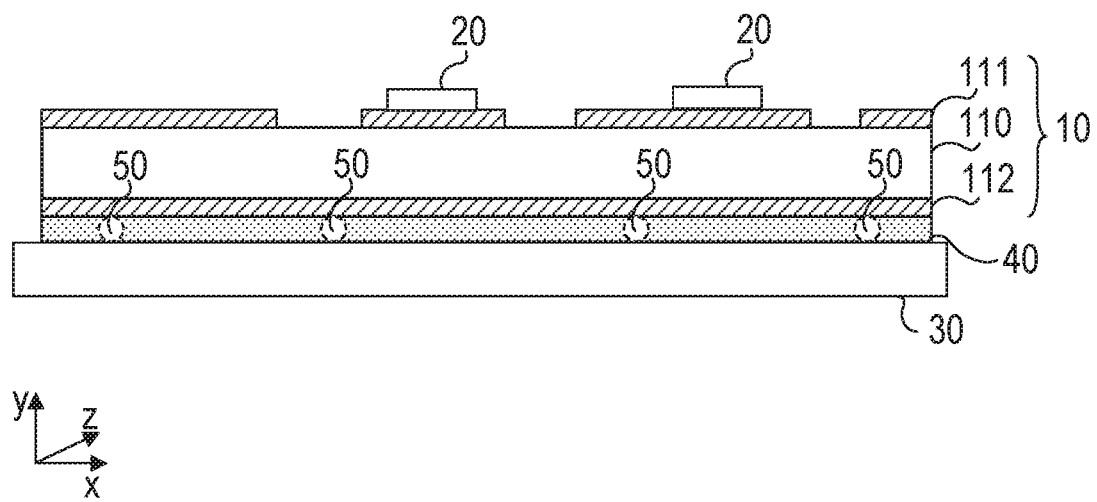
FIG. 4 schematically illustrates a cross-sectional view of a semiconductor substrate arrangement according to another example.

In order to prevent the heat-conducting layer 40 from becoming too thin (less than the minimum thickness di) during production, spacers 50 may be arranged between the substrate 10 and the base plate 30. This is schematically illustrated in FIG. 4. One or more spacers 50 may be arranged on the base plate 30 together with the layer 40 of heat-conducting material, for example, before arranging the substrate 10 on the layer 40 and the spacers 50. Usually, as few spacers 50 as possible are used in order to save costs. According to one example, one spacer 50 is arranged at each corner of a rectangular semiconductor substrate 10. When joining the substrate 10 to the base plate 30 by means of the layer 40, the material forming the layer 40 is usually liquid or viscous. Therefore, when pressing the substrate 10 on the layer 40, the still liquid or viscous material may be displaced in the horizontal directions x, z, and the thickness d1 of the layer d1 may be decreased. The spacers 50 prevent the substrate 10 from being pressed closer to the base plate 30. In this way, an even layer 40 having a desired thickness d1 over the entire surface may he formed. The spacers 50 may remain between the substrate 10 and the base plate 30 after mounting/joining the substrate 10 onto the base plate 30. Mounting the substrate 10 on the base plate 30 may comprise a soldering process, for example, or a heating step wherein liquid is removed from the layer 40 in order to form a firm substance-to-substance bond between the substrate 10 and the base plate 30. The spacers 50 may have a rounded or a square cross-section, for example. Any other cross-sections, however, are also possible. As has been described with respect to FIG. 3 above, heat-conducting particles 62 may function as spacers.

According to another example, a maximum thickness d1 of the layer 40 of heat-conducting material may be controlled by the applied volume size or thickness of a so-called (solder) preform or a (solder) paste layer. The preform may be arranged between the semiconductor substrate 10 and the base plate 30 to form the layer 40 of heat-conducting material. The volume of the preform may be chosen such that after forming the connection between the substrate 10 and the base plate 30, it results in an average of the thickness d1 or at least 80% of the thickness di of the layer of heat-conducting material 40. A preform is generally provided as a solid piece that is fused by applying heat while forming the connection between the substrate 10 and the base plate 30. During the heating step, the height of the preform is generally reduced to a certain degree by pressing the substrate 10 onto the preform.

According to another example, a barrier may be provided on the base plate 30 that extends around the substrate 10 and that prevents the material (solder) from flowing outside of a defined area. In particular, the barrier may be arranged such that it ensures that the material of the layer 40 stays within a defined area below the substrate 10 during the mounting process (while it is liquid or viscous), The volume, and therefore the height of the preform or (solder) material may be chosen such that it results in the desired thickness of the layer 40 after connecting the substrate 10 to the base plate 30, that is, after rigidifying the material and forming the connection. The (solder) material generally has a certain surface tension which prevents the substrate 10 from sinking in too far into the material of the layer 40.

According to an even further example, a height limiter may be provided on top of the substrate 10 that is configured to prevent the thickness of the layer 40 from exceeding a maximum thickness. In particular, the height limiter prevents the substrate 10 from moving away from the substrate 10 in a vertical direction. A distance between the substrate 10 and the base plate 30 that is filled with the layer 40, therefore, is prevented from becoming greater than the maximum thickness.

As can be seen from the above, there are certain ways to prevent the layer 40 of heat-conducting material from becoming too thin, e.g., by using spacers having at least a minimum thickness, preforms having a minimum thickness, or providing barriers forming a certain volume below the substrate 10. By preventing the material from flowing outside of the volume in the horizontal plane, and due to a surface tension of the material, a minimum thickness can be adjusted. On the other hand, it may be ensured that a maximum thickness is not exceeded in different ways. For example, a preform may be provided having a thickness that equals or is less than the maximum thickness, or a height limiter may be used.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   a semiconductor substrate comprising a dielectric insulation layer, a first metallization layer attached to the dielectric insulation layer, and a second metallization layer attached to the dielectric insulation layer, wherein the dielectric insulation layer is disposed between the first and second metallization layers;
   a base plate; and
   a layer of heat-conducting material arranged between the semiconductor substrate and the base plate in a vertical direction of the power semiconductor module arrangement,
   wherein the layer of heat-conducting material is arranged adjacent to a plane surface of the semiconductor substrate and adjacent to a plane surface of the base plate,
   wherein the semiconductor substrate has a first thermal expansion coefficient of 8 ppm/K or lower,
   wherein the base plate has a second thermal expansion coefficient of 9 ppm/K or lower,
   wherein the layer of heat-conducting material has a third thermal expansion coefficient of 18 ppm/K or higher,
   wherein the layer of heat-conducting material has a thickness in the vertical direction of between 40 µm and 150 µm.

2. The power semiconductor module arrangement of claim 1, wherein the base plate comprises a metal matrix composite material.

3. The power semiconductor module arrangement of claim 1, wherein the dielectric insulation layer comprises at least one of $Al_2O_3$, AlN, and $Si_3N_4$.

4. The power semiconductor module arrangement of claim 1, wherein the first and second metallization layers each comprise at least one of copper, a copper alloy, aluminum, and an aluminum alloy.

5. The power semiconductor module arrangement of claim 1, wherein the first and second metallization layers each have a thickness in the vertical direction of between 0.1 mm to 2.0 mm.

6. The power semiconductor module arrangement of claim 1, wherein the thickness of the layer of heat-conducting material is between 70 µm and 120 µm.

7. The power semiconductor module arrangement of claim 1, wherein the thickness of the layer of heat-conducting material is between 40 µm and 70 µm.

8. The power semiconductor module arrangement of claim 1, further comprising a barrier formed on the base plate, wherein the barrier defines a first volume below the semiconductor substrate, wherein the volume is filled with a material forming the layer of heat-conducting material, wherein the volume has a height such that the thickness of the layer of heat-conducting material does not exceed a maximum thickness.

9. The power semiconductor module arrangement of claim 1, further comprising a height limiter arranged above the semiconductor substrate and configured to prevent a distance between the semiconductor substrate and the base plate in the vertical direction from exceeding a maximum distance.

10. The power semiconductor module arrangement of claim 1, further comprising at least one spacer arranged between the semiconductor substrate and the base plate, wherein the at least one spacer defines the thickness of the layer of heat-conducting material.

11. The power semiconductor module arrangement of claim 1, wherein the layer of heat-conducting material is a solder layer.

12. The power semiconductor module arrangement of claim 1, wherein the layer of heat-conducting material comprises at least one of Au, SnAu, SnAg, SnCu, SnSb, and $Sn_{63}Pb_{37}$.

13. The power semiconductor module arrangement of claim 1, wherein the thickness of the layer of heat-conducting material is controlled by an applied volume size or thickness of a preform or a layer of liquid or viscous material, and wherein the preform or the layer of liquid or viscous material is arranged between the semiconductor substrate and the base plate.

14. The power semiconductor module arrangement of claim 13, further comprising one or more spacers arranged between the semiconductor substrate and the base plate.

15. The power semiconductor module arrangement of claim 13, wherein the applied volume of the preform or layer of liquid or viscous material yields an average of the. thickness or at least 80% of the thickness of the layer of heat-conducting material.

16. The power semiconductor module arrangement of claim 15, further comprising one or more spacers arranged between the semiconductor substrate and the base plate.

17. The power semiconductor module arrangement of claim 1, wherein a difference between the thermal expansion coefficient of the semiconductor substrate and the thermal expansion coefficient of the base plate is 5 ppm/K or lower.

18. The power semiconductor module arrangement of claim 1, wherein a difference between the thermal expansion coefficient of the semiconductor substrate and the thermal expansion coefficient of the base plate is 3 ppm/K or lower.

19. The power semiconductor module arrangement of claim 1, wherein a difference between the thermal expansion coefficient of the semiconductor substrate and the thermal expansion coefficient of the base plate is 2 ppm/K or lower.

20. The power semiconductor module arrangement of claim 1, wherein the third thermal expansion coefficient of the layer of heat-conducting material is at least 18 ppm/K.

* * * * *

UNITED STATES PATENT AND TRADEMARK OFFICE
CERTIFICATE OF CORRECTION

PATENT NO. : 10,879,148 B2
APPLICATION NO. : 16/579099
DATED : December 29, 2020
INVENTOR(S) : R. Bayerer et al.

Page 1 of 1

It is certified that error appears in the above-identified patent and that said Letters Patent is hereby corrected as shown below:

In the Claims

Column 10, Line 32 (Claim 15, Line 3), please change "the." to -- the --.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*